US010601546B2

(12) United States Patent
Kumar et al.

(10) Patent No.: US 10,601,546 B2
(45) Date of Patent: Mar. 24, 2020

(54) DYNAMIC INTERLEAVER CHANGE FOR BIT LINE FAILURES IN NAND FLASH STORAGE

(71) Applicant: SK Hynix Inc., Gyeonggi-do (KR)

(72) Inventors: Naveen Kumar, San Jose, CA (US); Aman Bhatia, San Jose, CA (US); Yu Cai, San Jose, CA (US); Chenrong Xiong, San Jose, CA (US); Fan Zhang, San Jose, CA (US); Xuanxuan Lu, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 33 days.

(21) Appl. No.: 16/100,952

(22) Filed: Aug. 10, 2018

(65) Prior Publication Data

US 2019/0305890 A1 Oct. 3, 2019

Related U.S. Application Data

(60) Provisional application No. 62/652,181, filed on Apr. 3, 2018.

(51) Int. Cl.
*H04L 1/00* (2006.01)
*H03M 13/27* (2006.01)
*G11C 7/12* (2006.01)

(52) U.S. Cl.
CPC ............. *H04L 1/0071* (2013.01); *G11C 7/12* (2013.01); *H03M 13/2707* (2013.01); *H04L 1/0057* (2013.01)

(58) Field of Classification Search
CPC ........ H04L 1/0071; H04L 1/0057; G11C 7/12; H03M 13/2707
See application file for complete search history.

(56) References Cited

U.S. PATENT DOCUMENTS

| | | | | |
|---|---|---|---|---|
| 5,671,178 A | * | 9/1997 | Park | G11C 29/82 |
| | | | | 365/185.22 |
| 7,058,782 B2 | * | 6/2006 | Henderson | G06F 11/106 |
| | | | | 711/170 |
| 7,770,010 B2 | | 8/2010 | Flynn | |
| 8,335,962 B2 | | 12/2012 | Eberlein et al. | |
| 8,560,927 B1 | * | 10/2013 | Pagiamtzis | G06F 11/10 |
| | | | | 714/704 |
| 10,201,026 B1 | * | 2/2019 | Humblet | H04W 28/20 |
| 2003/0226074 A1 | * | 12/2003 | Ohlhoff | G11C 29/56 |
| | | | | 714/718 |

(Continued)

OTHER PUBLICATIONS

Yoshimoto, S., et al., "Multiple-Bit-Upset and Single-Bit-Upset Resilient 8T SRAM Bitcell Layout with Divided Wordline Structure", 2011 IEEE 17th International On-Line Testing Symposium, Date of Conference: Jul. 13-15, 2011, IEEE, Published: Aug. 22, 2011, pp. 151-156. (Year: 2011).*

*Primary Examiner* — Kyle Vallecillo
(74) *Attorney, Agent, or Firm* — Kilpatrick Townsend & Stockton LLP

(57) ABSTRACT

A dynamic interleaver performs a read operation to identify bit lines with high failures, and form groups of data bits for parity bits computation, such that each group includes at most one data bit from the bit lines with high failures. Thus, the interleave selects the bit lines with high failures based on a most recent read test, and can be adjusted according to the conditions of the storage device.

20 Claims, 11 Drawing Sheets

(56) References Cited

U.S. PATENT DOCUMENTS

| | | | |
|---|---|---|---|
| 2010/0269018 A1* | 10/2010 | Clark | G06F 9/3867 714/763 |
| 2014/0164879 A1* | 6/2014 | Tam | G06F 11/1012 714/773 |
| 2014/0245098 A1* | 8/2014 | Sharon | G06F 11/1012 714/755 |
| 2014/0355345 A1* | 12/2014 | Avila | G11C 16/3404 365/185.09 |
| 2016/0162353 A1* | 6/2016 | Manohar | G06F 11/1048 714/760 |

* cited by examiner

FIG. 6A

| Subset 1 | | | Subset 2 | | | Subset 3 | | | Subset 4 | | | |
|---|---|---|---|---|---|---|---|---|---|---|---|---|
| Subset (0, 1) | | | b4 | b5 | b6 | b7 | b8 | b9 | b10 | b11 | b12 | WL0 |
| b1 | b2 | b3 | Subset (1, 2) | | | b7 | b8 | b9 | b10 | b11 | b12 | WL1 |
| b1 | b2 | b3 | Subset (2, 2) | | | b7 | b8 | b9 | b10 | b11 | b12 | WL2 |
| b1 | b2 | b3 | Subset (3, 2) | | | b7 | b8 | b9 | b10 | b11 | b12 | WL3 |
| Failed Bit Lins | | | | | | | | | | | | |
| Subset (4, 1) | | | b4 | b5 | b6 | b7 | b8 | b9 | b10 | b11 | b12 | WL4 |

FIG. 6B

| Subset 1 | | | Subset 2 | | | Subset 3 | | | Subset 4 | | | |
|---|---|---|---|---|---|---|---|---|---|---|---|---|
| b1 | b2 | b3 | Subset (0, 2) | | | b7 | b8 | b9 | b10 | b11 | b12 | WL0 |
| Subset (1, 1) | | | b4 | b5 | b6 | b7 | b8 | b9 | b10 | b11 | b12 | WL1 |
| b1 | b2 | b3 | b4 | b5 | b6 | Subset (2, 3) | | | b10 | b11 | b12 | WL2 |
| b1 | b2 | b3 | b4 | b5 | b6 | Subset (3, 3) | | | b10 | b11 | b12 | WL3 |
| Failed Bit Lins | | | | | | | | | | | | |
| b1 | b2 | b3 | Subset (4, 2) | | | b7 | b8 | b9 | b10 | b11 | b12 | WL4 |

FIG. 6C

| Subset 1 | | | Subset 2 | | | Subset 3 | | | Subset 4 | | | |
|---|---|---|---|---|---|---|---|---|---|---|---|---|
| b1 | b2 | b3 | b4 | b5 | b6 | Subset (0, 3) | | | b10 | b11 | b12 | WL0 |
| b1 | b2 | b3 | b4 | b5 | b6 | Subset (1, 3) | | | b10 | b11 | b12 | WL1 |
| Subset (2, 1) | | | b4 | b5 | b6 | b7 | b8 | b9 | b10 | b11 | b12 | WL2 |
| b1 | b2 | b3 | b4 | b5 | b6 | b7 | b8 | b9 | Subset (3, 4) | | | WL3 |
| Failed Bit Lins | | | | | | | | | | | | |
| b1 | b2 | b3 | b4 | b5 | b6 | Subset (4, 3) | | | b10 | b11 | b12 | WL4 |

FIG. 6D

| Subset 1 | | | Subset 2 | | | Subset 3 | | | Subset 4 | | | |
|---|---|---|---|---|---|---|---|---|---|---|---|---|
| b1 | b2 | b3 | b4 | b5 | b6 | b7 | b8 | b9 | Subset (0, 4) | | | WL0 |
| b1 | b2 | b3 | b4 | b5 | b6 | b7 | b8 | b9 | Subset (1, 4) | | | WL1 |
| b1 | b2 | b3 | b4 | b5 | b6 | b7 | b8 | b9 | Subset (2, 4) | | | WL2 |
| Subset (3, 1) | | | b4 | b5 | b6 | b7 | b8 | b9 | b10 | b11 | b12 | WL3 |
| Failed Bit Lins | | | | | | | | | | | | |
| b1 | b2 | b3 | b4 | b5 | b6 | b7 | b8 | b9 | Subset (4, 4) | | | WL4 |

|  Subset 1  |  | | Subset 2 | | | Subset 3 | | | Subset 4 | | | |
|---|---|---|---|---|---|---|---|---|---|---|---|---|
| b1 | b2 | b3 | b4 | b5 | b6 | b7 | b8 | b9 | b10 | b11 | b12 | WL0 |
| b1 | b2 | b3 | b4 | b5 | b6 | b7 | b8 | b9 | b10 | b11 | b12 | WL1 |
| b1 | b2 | b3 | b4 | b5 | b6 | b7 | b8 | b9 | b10 | b11 | b12 | WL2 |
| Failed Bit Lins | | | | | | | | | | | | |
| b1 | b2 | b3 | b4 | b5 | b6 | b7 | b8 | b9 | b10 | b11 | b12 | WL3 |

FIG. 7A

|  Subset 1  |  | | Subset 2 | | | Subset 3 | | | Subset 4 | | | |
|---|---|---|---|---|---|---|---|---|---|---|---|---|
| b1 | b2 | b3 | b4 | b5 | b6 | b7 | b8 | b9 | b10 | b11 | b12 | WL0 |
| b1 | b2 | b3 | b4 | b5 | b6 | b7 | b8 | b9 | b10 | b11 | b12 | WL1 |
| b1 | b2 | b3 | b4 | b5 | b6 | b7 | b8 | b9 | b10 | b11 | b12 | WL2 |
| Failed Bit Lins | | | | | | | | | | | | |
| b1 | b2 | b3 | b4 | b5 | b6 | b7 | b8 | b9 | b10 | b11 | b12 | WL3 |

FIG. 7B

|  Subset 1  |  | | Subset 2 | | | Subset 3 | | | Subset 4 | | | |
|---|---|---|---|---|---|---|---|---|---|---|---|---|
| b1 | b2 | b3 | b4 | b5 | b6 | b7 | b8 | b9 | b10 | b11 | b12 | WL0 |
| b1 | b2 | b3 | b4 | b5 | b6 | b7 | b8 | b9 | b10 | b11 | b12 | WL1 |
| b1 | b2 | b3 | b4 | b5 | b6 | b7 | b8 | b9 | b10 | b11 | b12 | WL2 |
| Failed Bit Lins | | | | | | | | | | | | |
| b1 | b2 | b3 | b4 | b5 | b6 | b7 | b8 | b9 | b10 | b11 | b12 | WL3 |

FIG. 7C

|  Subset 1  |  | | Subset 2 | | | Subset 3 | | | Subset 4 | | |
|---|---|---|---|---|---|---|---|---|---|---|---|
| b1 | b2 | b3 | b4 | b5 | b6 | b7 | b8 | b9 | Subset (0, 4) | | WL0 |
| b1 | b2 | b3 | b4 | b5 | b6 | b7 | b8 | b9 | Subset (1, 4) | | WL1 |
| b1 | b2 | b3 | b4 | b5 | b6 | b7 | b8 | b9 | Subset (2, 4) | | WL2 |
| Failed Bit Lins | | | | | | | | | | | |
| b1 | b2 | b3 | b4 | b5 | b6 | b7 | b8 | b9 | Subset (4, 4) | | WL3 |

FIG. 7D

DYNAMIC INTERLEAVER CHANGE FOR BIT LINE FAILURES IN NAND FLASH STORAGE

CROSS-REFERENCES TO RELATED APPLICATIONS

The present application claims priority to Provisional Application No. 62/652,181 entitled "ON THE FLY INTERLEAVER CHANGE FOR BIT LINE FAILURES IN NAND FLASH STORAGE," filed Apr. 3, 2018, which is assigned to the assignee hereof and expressly incorporated by reference herein in its entirety.

BACKGROUND OF THE INVENTION

The present invention relates generally to systems and methods for storage devices, and specifically to improving performance of non-volatile memory devices.

Solid-state memory is ubiquitously used in a variety of electronic systems including, for example, consumer electronic devices (e.g., cellular phones, cameras, computers, etc.) and in enterprise computing systems (e.g., hard drives, random access memory (RAM), etc.). Solid-state memory has gained popularity over mechanical or other memory storage techniques due to latency, throughput, shock resistance, packaging, and other considerations. Among these non-volatile memory devices, NAND flash memory devices are popular due to low manufacturing cost for a high degree of integration.

Flash-memory based solid state disk (SSD) system often employ parity bits for error detection correction. In some conventional system, data bits associated with a bit line are often grouped in the calculation of a parity bit. The inventors have observed that, in some NAND drives, certain bit lines can have much higher bit error rate (BER) compared with other bit lines across word lines during the life of the drive. During chip-kill recovery, multiple word line failures cannot be recovered due to errors happening at same locations due to bit line failures.

In the past, interleavers, which is a device that performs an interleaving function to alter the sequence of selected data, have been proposed to improve the effectiveness of error detection using parities. For example, in one conventional interleaver, the parity is encoded by grouping data bits in a diagonal fashion. However, the inventors have observed that sequential bit lines failures cannot be recovered through a diagonal interleaver. Therefore, there is a need for improved interleavers for more effective error detection and correction.

BRIEF SUMMARY OF THE INVENTION

In embodiments of the invention, dynamic interleavers and dynamic interleaving methods are provided to select data bits to overcome systematic failures, such as bit line failures. In some embodiments, the interleaving method can include identifying failed bit lines, grouping the data bits into groups for parity bit grouping such that each group includes no more than one data bit from the failed bit lines. Some embodiments also provide a dynamic interleaver which adjusts the interleaver or interleaving method according to a latest test result. In this manner, the interleaver can be dynamically formed, or changed on the fly, to optimize the effectiveness. As an example, an on the fly change interleaver is triggered by the firmware for writing data in a superblock after refresh.

In some embodiments, the method includes a dynamic interleaver in which a read operation is carried out to identify bit lines with high failures, and forming groups of data bits for parity bits computation, such that each group includes at most one data bit from the bit lines with high failures. Thus, the interleaver selects the bit lines with high failures based on a most recent read test, and can be adjusted according to the conditions of the storage device.

In some embodiments of the present invention, a non-volatile data storage device includes memory cells arranged in a two-dimensional array having rows and columns, each row associated with a word line and each column associated with a bit line. The non-volatile data storage device also includes a memory controller coupled to the memory cells for controlling operations of the memory cells. The memory controller is configured to perform a read operation in response to a read command from a host, and decode data from the read operation to identify error count in each bit line and determine that there are M failed bit lines that have error counts exceeding a threshold value. The method includes forming multiple groups of data bits, in which each group of data bits includes one data bit from each word line and each group of data bits includes at most one data bit from any of the M failed bit lines. Next, parity bits are computed for each group of data bits. In this arrangement, each group of data bits includes at most one error bit from the M failed bit lines. The storage device can then correct errors in the data bits based on the parity bits.

In some embodiments, the memory controller is further configured to perform interleave of data bits to form parity bits as follows. First, for each data word line, grouping data bits into subsets of M data bits, including a subset composed of M data bits from the M failed bit lines. For the parity word line, subsets of parity bits are formed, wherein each subset of parity bits are computed for a group of data bits comprising one subset from each word line and including only one subset of data bits from the M failed bit lines.

According to some embodiments, a dynamic interleave process for parity computation is provided for a storage device. In the storage device, memory cells are arranged in a two-dimensional array having rows and columns, each row associated with a word line and each column associated with a bit line. The storage device also has a memory controller coupled to the memory cells for controlling operations of the memory cells. The memory controller is configured to decode data from a read operation to identify error count in each bit line and determine that there are M failed bit lines that have error counts exceeding a threshold value. The controller performs interleave of data bits to form parity bits by forming multiple groups of data bits, wherein each group of data bits includes one data bit from each word line and each group of data bits includes at most one data bit from any of the M failed bit lines. The controller also computes a parity bit for each group of data bits. In this process, each group of data bits includes at most one error bit from the M failed bit lines.

Various additional embodiments, features, and advantages of the present invention are provided with reference to the detailed description and accompanying drawings that follow.

BRIEF DESCRIPTION OF THE DRAWINGS

FIGS. 6A, 6B, 6C, and 6D are simplified schematic diagrams illustrating part of a memory array in a non-volatile data storage device according to some embodiments of the present invention;

FIGS. 7A, 7B, 7C, and 7D are simplified schematic diagrams illustrating part of a memory array in a non-volatile data storage device according to alternative embodiments of the present invention;

DETAILED DESCRIPTION OF THE INVENTION

Figure 1:
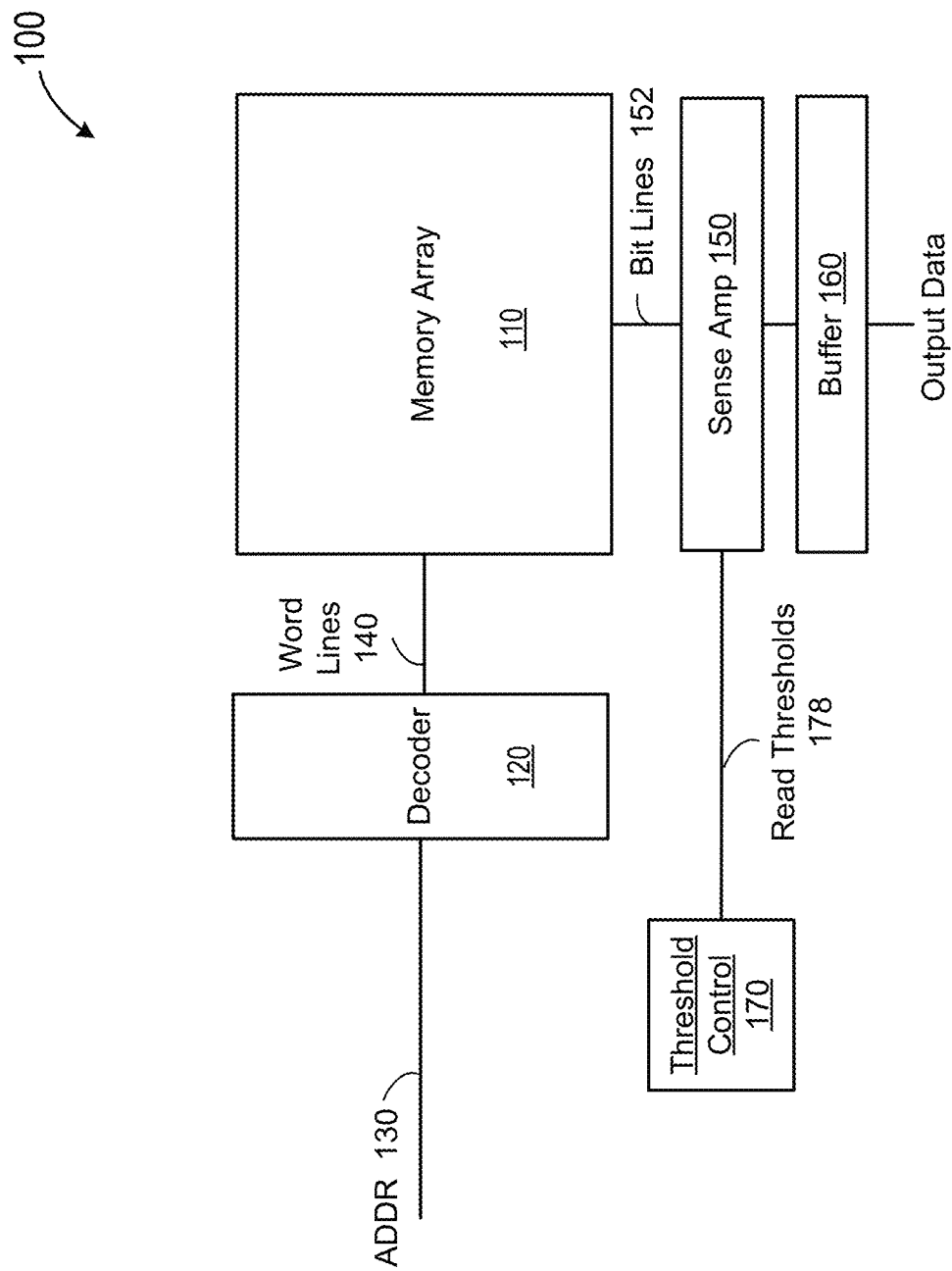
FIG. 1 is a simplified block diagram of a memory device according to some embodiments of the present invention.

FIG. 1 is a simplified block diagram of a memory device according to some embodiments of the present invention. In this example, a flash memory device 100 includes a memory cell array 110 having a plurality of non-volatile memory cells. In some embodiments, the memory cells are arranged in a plurality of memory blocks. Each memory block can include multiple non-volatile memory cells, each memory block being associated with a corresponding address. Memory device 100 also includes a decoder 120, for example a row decoder. In an example, decoder 120 receives a command for a memory operation with an address ADDR 130, e.g., a read command with a read address. The address 130 can be a logic address. In an embodiment, the memory operations, such as read, write or program, and erase, etc., are directed to a group of memory cells, for example, a page or a sector, or a block. As described above, a block can include multiple pages. A read or program command is often directed to a page, and an erase command can be directed to a block. Depending on the embodiment, a page or a sector can be 0.5 Kbytes to 4 Kbytes, or a different size. Depending on the embodiments, a page or a sector can include memory cells coupled to the same word line. In this case, decoder 120 selects word lines (WL) 140 based on information on ADDR 130 for selecting a memory page, which can be a row of memory cells coupled to the selected word line. Therefore, pages and word lines are used interchangeably.

A sense amplifier block 150 is coupled to memory cell array 110 through bit lines 152. A buffer block 160 is coupled to sense amplifier block 150 and provides output data to an external device. In a read operation, sense amplifier block 150 senses the data stored in each memory cell of the memory cell array 110 and provides the data to buffer block 160. In a write or program operation, buffer block 160 presents the data to be written or programmed to the memory array 110.

During a memory read operation, the charges in a non-volatile memory cell selected by a word line are read out. Depending on the charges stored in a memory cell, its cell threshold voltage can vary. A read voltage higher than cell threshold voltage can be used to determine the data stored in the memory cell. In some embodiments, each of the non-volatile memory cells can be a multilevel memory cell, and multiple threshold voltages are used to determine the data state of the memory cell, as represented by a bit pattern. In these cases, a threshold control circuit 170, which provides read thresholds 178, can be used to control the threshold voltages.

Figure 2:
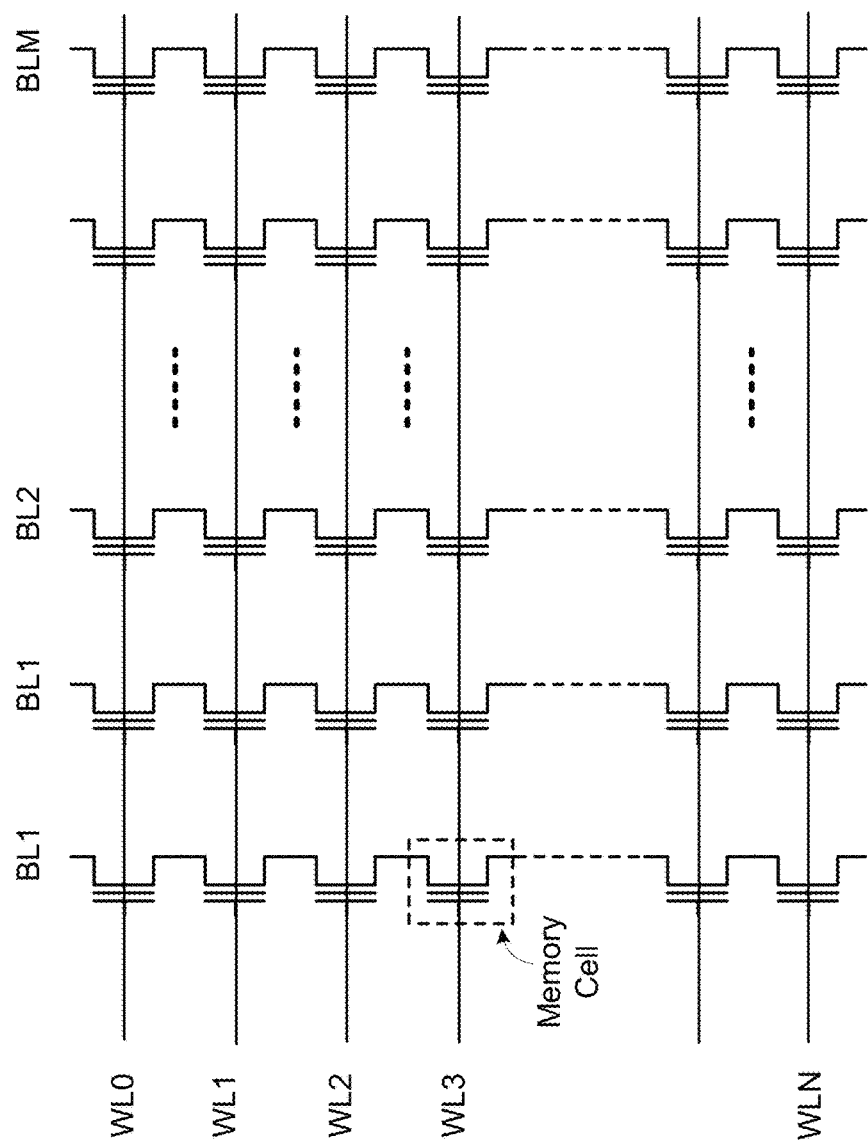
FIG. 2 is a simplified schematic diagram illustrating a memory array according to some embodiments of the present invention.

FIG. 2 is a simplified schematic diagram illustrating a memory array according to some embodiments of the present invention. As shown in FIG. 2, memory array 200 includes memory cells arranged in a two-dimensional array having rows and columns. Each row of memory cells are associated with a word line (WL). For example, WL0, WL1, WL2, WL3, . . . , WLN, etc. Each column of memory cells are associated with a bit line (BL). For example, BL1, BL2, BL 3, . . . , BLM, etc. In some embodiments, the memory cells associated with each bit line can include multiple data bits and a parity bit derived from the data bits. For example, memory cells associated with bit line BL1 can have a parity bit stored in the memory cell coupled to word line WLN. In some embodiments, can represent part of a NAND Flash devices.

Figure 3:
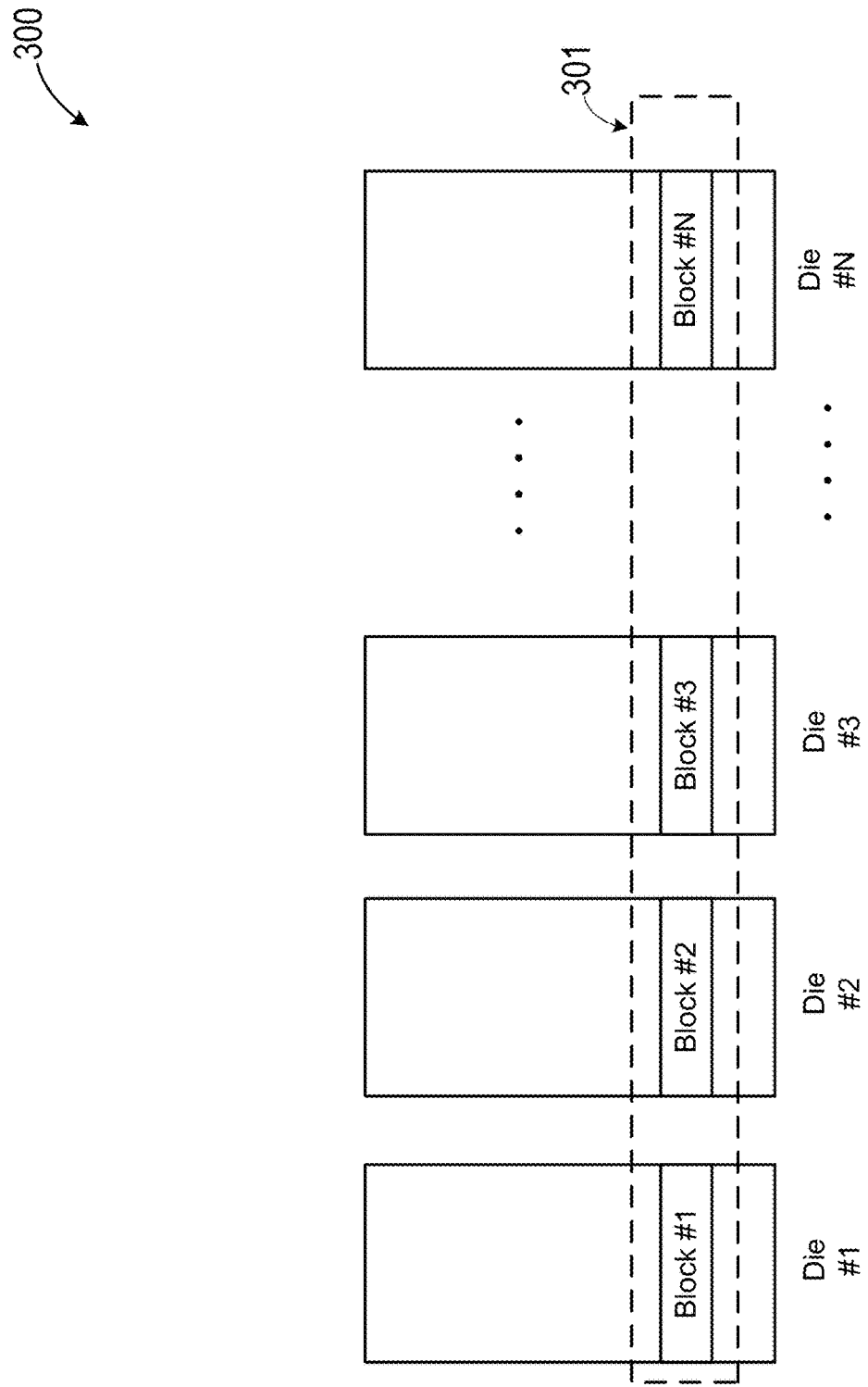
FIG. 3 is a simplified diagram illustrating a method for operating a super block according to some embodiments of the present invention.

FIG. 3 is a simplified diagram illustrating a method for operating a super block according to some embodiments of the present invention. As shown in FIG. 3, a non-volatile data storage device 300 can include multiple memory dies, labeled Die #1, Die #2, Die #3, . . . , Die #N. In this example, a super block 301 can include a block from each die, e.g., Block #1 from Die #1, Block #2 from Die #2, Block #3 from Die #3, . . . , Block #N from Die #N. In other embodiments, a super block can include multiple blocks, but the blocks in the super blocks are not restricted to blocks from different dies. A super block can be used as a logical unit in a memory operation. For example, in a super block, one of the blocks can be used as a parity block to store parity bits, and the remaining blocks can be used as data blocks to store data. As an example, the parity block can store parity bits obtained by an exclusive OR (XOR) operation of the corresponding data bits in the data blocks.

Flash-memory based solid state disk (SSD) drive can contain many flash memory dies. Each flash die can contain thousands of physical blocks. Each block can contain hundreds or thousands of flash pages. A NAND Flash chip, like any other semiconductor, may fail and this may be referred to as a chip-kill. In order to protect computer memory systems from any single memory chip failure as well as multi-bit errors from any portion of a single memory chip, some systems distribute data bits of a ECC (error checking and correcting) code word across multiple memory chips in a super block, such that the failure of any single memory chip will affect only one ECC bit per word. This allows memory contents to be reconstructed despite the complete failure of one chip. As explained above, bit line failures can make chip-kill recovery difficult.

Figure 4A:
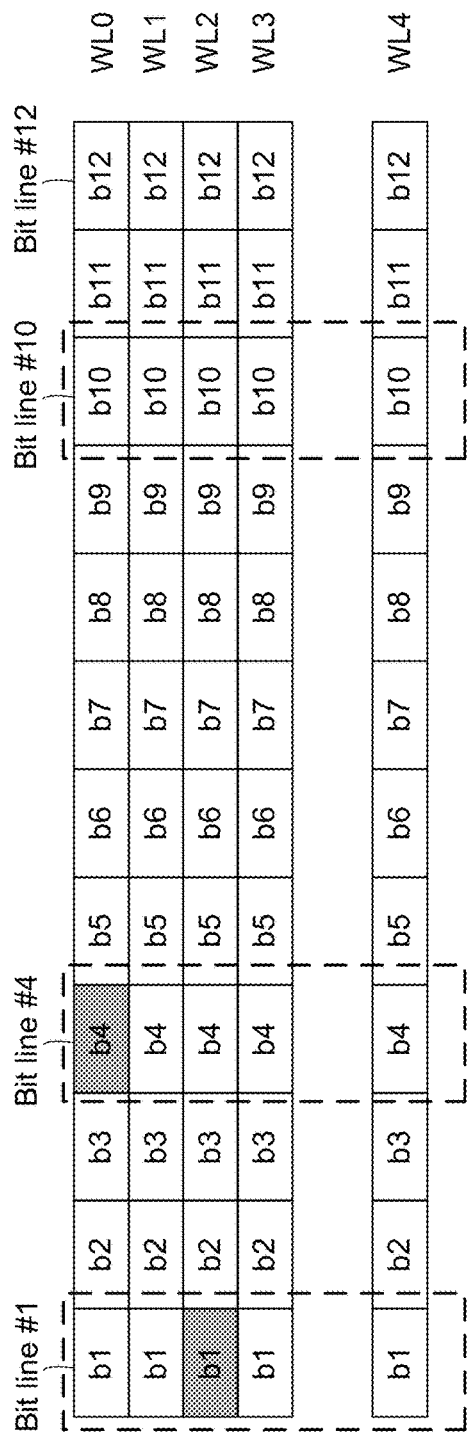
FIGS. 4A and 4B are simplified schematic diagrams illustrating part of a memory array in a non-volatile data storage device according to some embodiments of the present invention.
Figure 4B:
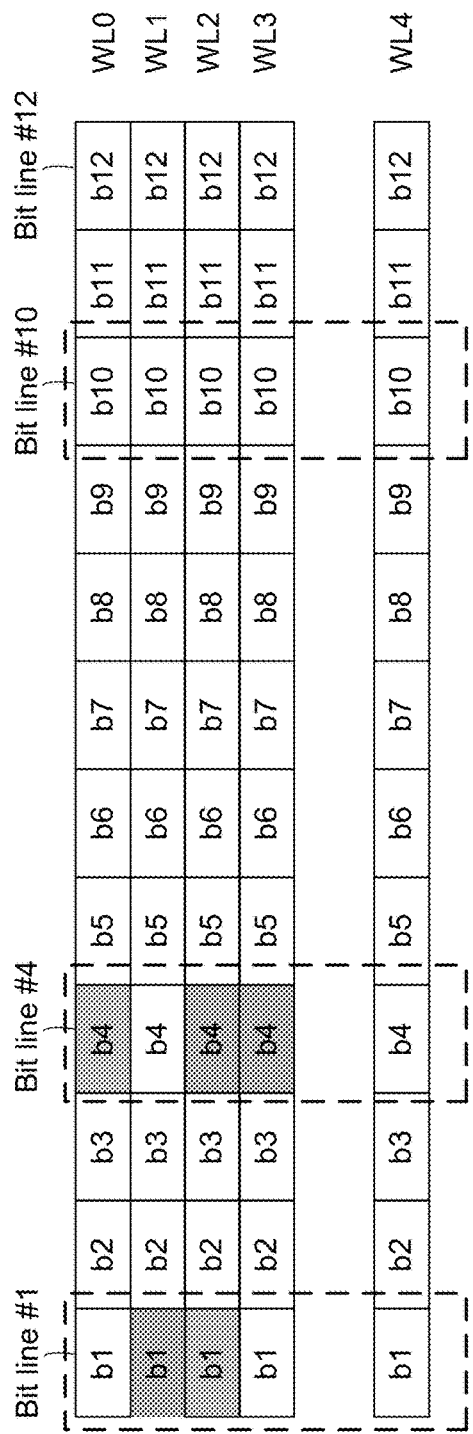

FIGS. 4A and 4B are simplified schematic diagrams illustrating part of a memory array in a non-volatile data storage device according to some embodiments of the present invention. The non-volatile data storage device includes memory cells arranged in a two-dimensional array having rows and columns, each row associated with a word line and each column associated with a bit line. A super block can have a large number of word lines and bit lines, and the bit lines can be distributed in different memory dies. The memory cells associated with each bit line include multiple data bits and a parity bit derived from the data bits, a parity word line includes a parity bit from each bit line.

To simplify the description, FIG. 4A illustrates a logical representation of a portion of the memory array with 5 word lines, WL0, WL1, WL2, WL3, and WL4, and 12 bit lines. The 12 memory cells that associate with each word line are labeled as b1, b2, b3, . . . , and b12, respectively. For example, the memory cells associated with bit line #1 are labeled as "b1." The memory cells associated with bit line #2 are labeled as "b2." Similarly, the memory cells associated with bit line #12 are labeled as "b12." In this example, word lines WL0-WL3 are data word lines, and word line WL4 is a parity word line and the data bits b1-b12 associated with word line WL4 are parity bits. For example, data bit b1 of WL4 is a parity bit computed from data bits b1 associated WL0-WL3. Similarly, memory cell b1 of WL4 is a parity bit computed from memory cells b1 associated with WL0-WL3. Further, memory cell b12 of WL4 is a parity bit computed from memory cells b12 associated with WL0-WL3.

In some embodiments, the parity bit is computed from an exclusive OR (XOR) operation of a group of memory cells. It is known that parity bits based on XOR operation can be used to detect a single bit error, but not multiple bit errors. FIG. 4A shows two single bit errors as marked by shaded blocks in bit "b1" of WL2 and bit "b4" of WL0. These single bit errors can be detected with the parity bits. In contrast, FIG. 4B shows an example in which multiple bit errors are present. As shown in FIG. 4B, memory cells coupled to bit line #1 include two error bits, namely, bit "b1" coupled to WL1 and "b1" coupled to WL2. Similarly, memory cells coupled to bit line #4 include three error bits, namely, bit "b4" coupled to WL1, bit "b4" coupled to WL2, and bit "b4" coupled to WL3.

Memory cells in a storage device are known to degrade over time. For example, a bit line failure, e.g., a stuck bit line, can cause all bits coupled to the bit line to fails. The inventors have observed that, in some NAND drives, there may be certain bit lines which have much higher bit error rate (BER) compared with other bit lines across word lines during the life of the drive. During chip-kill recovery, multiple word line failures cannot be recovered due to errors happening at the same locations due to bit line failures. Embodiments of the present invention provide improved methods and devices for performing interleave of data bits to form parity bits.

In some embodiments, a dynamic interleaver is provided in which a read operation is carried out to identify bit lines with high failures, and forming groups of data bits for parity bits computation, such that each group includes at most one data bit from the bit lines with high failures. Thus, the interleave selects the bit lines with high failures based on a most recent read test, and can be adjusted according to the conditions of the storage device.

In some embodiments of the present invention, a non-volatile data storage device includes memory cells arranged in a two-dimensional array having rows and columns, each row associated with a word line and each column associated with a bit line. The non-volatile data storage device also includes a memory controller coupled to the memory cells for controlling operations of the memory cells. The memory controller is configured to perform a read operation in response to a read command from a host, and decode data from the read operation to identify error count in each bit line and determine that there are M failed bit lines that have error counts exceeding a threshold value. The method includes forming multiple groups of data bits, in which each group of data bits includes one data bit from each word line and each group of data bits includes at most one data bit from any of the M failed bit lines. Next, parity bits are computed for each group of data bits. In this arrangement, each group of data bits includes at most one error bit from the M failed bit lines. The storage device can then correct errors in the data bits based on the parity bits.

In some embodiments, the memory controller is further configured to perform interleave of data bits to form parity bits as follows. First, for each data word line, grouping data bits into subsets of M data bits, including a subset composed of M data bits from the M failed bit lines. For the parity word line, subsets of parity bits are formed, wherein each subset of parity bits are computed for a group of data bits comprising one subset from each word line and including only one subset of data bits from the M failed bit lines.

The method is described below with reference to FIGS. 5A and 5B, FIGS. 6A, 6B, 6C, and 6D, and FIGS. 7A, 7B, 7C, and 7D.

Figure 5A:
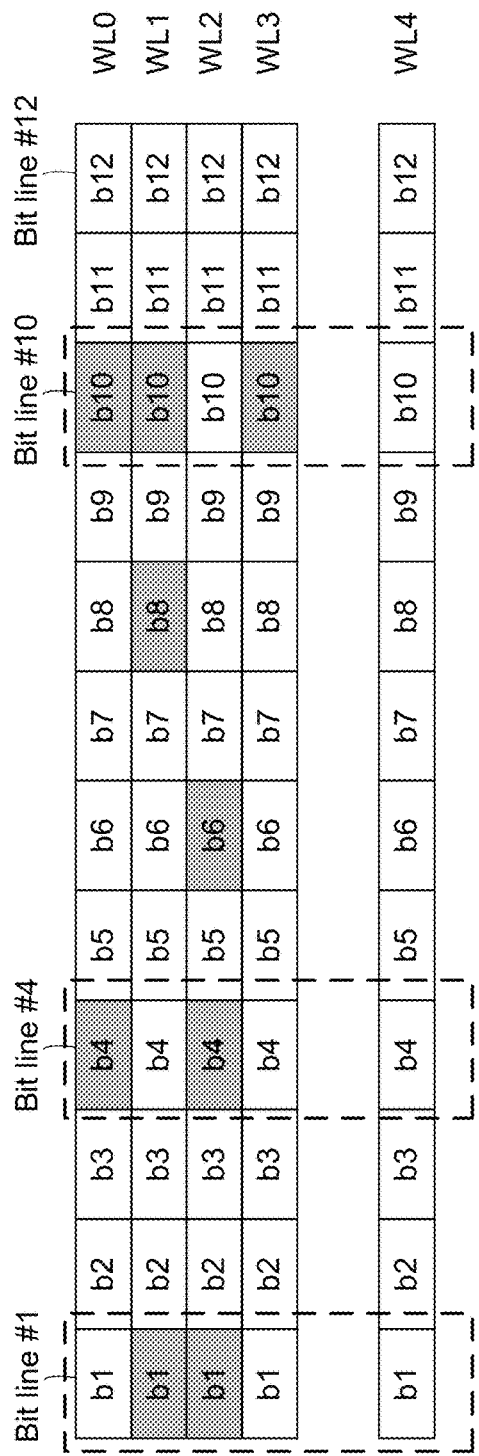
FIGS. 5A and 5B are simplified schematic diagrams illustrating part of a memory array in a non-volatile data storage device according to some embodiments of the present invention.
Figure 5B:
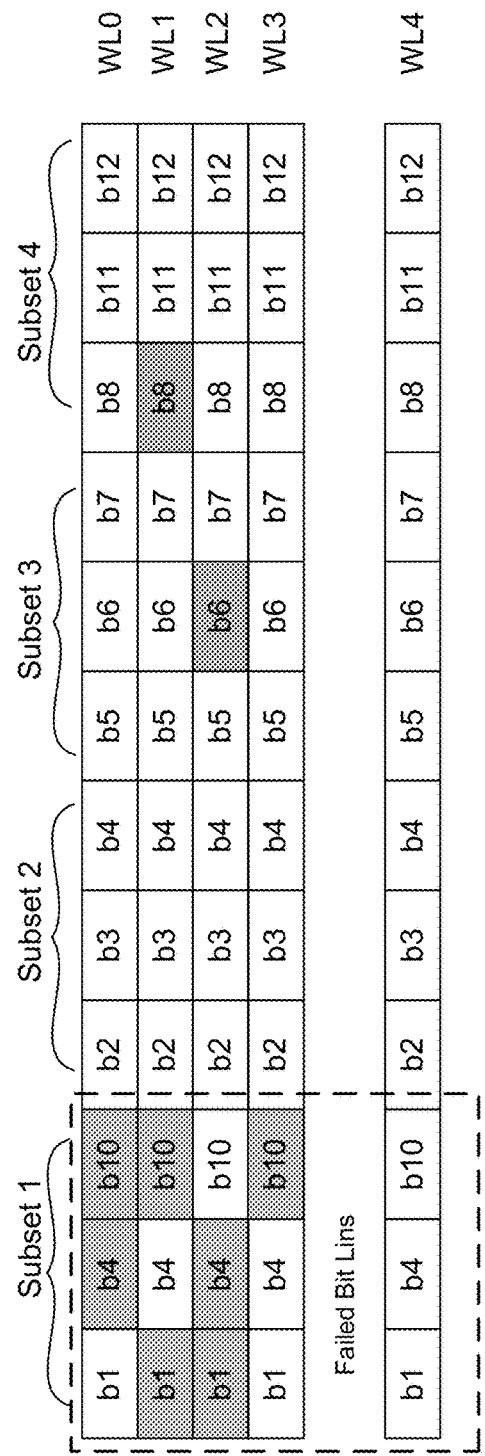

FIGS. 5A and 5B are simplified schematic diagrams illustrating part of a memory array in a non-volatile data storage device according to some embodiments of the present invention. For example, in FIG. 5A, bit line #1, bit line #4, and bit line #10 are identified as bit lines that have high failures. In this case, M=3, and these three bit lines are identified as failed bit lines that have error counts exceeding a threshold value. The memory controller then performs interleave of data bits to form parity bits. In FIG. 5B, the data bits in each word line are grouped into subsets. For example, data bits b1, b4, and b10 from the three failed bit lines (#1, #4, and #10) are grouped in to subset 1. The rest of the data bits are grouped in to subsets of three data bits. For example, data bits b2, b3, and b5 are grouped into subset 2, data bits b6, b7, and b8 are grouped into subset 3, and data bits b9, b11, and b12 are grouped into subset 4. These subsets of data bits are selected in the interleave for computing parity bits.

FIGS. 6A, 6B, 6C, and 6D are simplified schematic diagrams illustrating part of a memory array in a non-volatile data storage device according to some embodiments of the present invention. FIG. 6A is similar to FIG. 5B, in which the data bits in each word line are grouped into subsets. Each subsets include three (M=3, the number of failed bit lines) data bits. To simplify the illustration, in FIGS. 6A-6D, the failed bit lines are now labeled as bit line #1, bit line #2, and bit line #3. Further, let subset (K, I) denote subset #K in word line I. For example, the subsets in word line 0, WL0, are listed below.

subset (0, 1)=bits b1, b2, and b3 with WL0;
    subset (0, 2)=bits b4, b5, and b6 with WL0;
    subset (0, 3)=bits b7, b8, and b9 with WL0; and
    subset (0, 4)=bits b10, b11, and b12 with WL0.

FIG. 6A shows the first interleaved group in shaded blocks. The first interleaved group includes subset (0, 1) (with bits b0, b1, and b2 from the failed bit lines and word line WL0) interleaved with subsets (1, 2), (2, 2), and (3, 2). Subset (1, 2) includes bits b4, b5, and b6 with WL1. Subset (2, 2) includes bits b4, b5, and b6 with WL2. Subset (3, 2) includes bits b4, b5, and b6 with WL3. The parity subset is computed and stored in subset (4, 1) (with bits b0, b1, and b2 from failed bit lines and WL4). Similarly, FIG. 6B shows that subset (1, 1) (with bits b0, b1, and b2 from the failed bit lines and word line WL1) is interleaved with subsets (0, 2), (2, 3), and (3, 3) with parity subset in subset (4, 2) (with bits b4, b5, and b6 with WL4). In FIG. 6C, subset (2, 1) (with bits b0, b1, and b2 from the failed bit lines and word line WL2) is interleaved with subsets (0, 3), (1, 3), and (3, 4) with parity subset in subset (4, 3) (with bits b7, b8, and b9 with WL4). In FIG. 6D, subset (3, 1) (with bits b0, b1, and b2 from the failed bit lines and word line WL3) is interleaved with subsets (0, 4), (1, 4), and (2, 4) with parity subset in subset (4, 4) (with bits b10, b11, and b12 with WL4). In this arrangement, each interleaved group includes at most one subset from the failed bit lines, and the parity bits in the parity subsets are computed from data bits that include at most one data bit from the failed bit lines.

FIGS. 7A, 7B, 7C, and 7D are simplified schematic diagrams illustrating part of a memory array in a non-volatile data storage device according to alternative embodiments of the present invention. FIGS. 7A, 7B, 7C, and 7D are similar to FIGS. 6A, 6B, 6C, and 6D, except only three data word lines are present in FIGS. 7A, 7B, 7C, and 7D. As a result, the subsets in the failed bits lines are all used in interleaved groups involving subsets 1-3 in each word line. Therefore, the last interleaved group including subsets (0, 4), (1, 4), and (2, 4) does not include a subset from the failed bit lines. The parity bits for the last interleaved group are stored in subset (4, 4). In embodiments where there are more bit lines than are needed for interleaving the subsets in failed bit lines, the subsets can be formed along the unused bit lines.

In some embodiments, the memory controller is further configured to perform dynamic interleave of data bits to form parity bits by comparing the count of failed bit lines M with a threshold for triggering dynamic interleave. Upon determining that M is greater than the threshold for triggering dynamic interleave, the controller performs interleave of data bits to form parity bits. The threshold for dynamic interleave can be varied during a life time of the non-volatile data storage device. The parity bits can be computed by an exclusive-OR (XOR) operation of selected data bits. Alternatively, other coding schemes can also be used.

In some embodiments, the interleave process for determining parity bits can be described as follows. First, the following parameters are defined.
Let B_wl be the number of total bit lines of interest, or the number of bits in a codeword. (In the example described above, B_wl=12);
Let M be number of failed bit lines. (In the example described above, M=3.)
Let K be the number of word lines to be interleaved. (In the example described above, K=4 or 3.).

The interleave process for determining parity bits includes the following steps.
1) Detect M bit lines failing and initialize on the fly interleaver.
2) Divide B_Wl in L subsets where L=B_wl/M. (e.g., L=12/3=4)
3) L>K the constraint in disclosure is checked. (e.g., L≥K indicates there are enough subsets to interleave word lines in the bad bit lines.)
4) Interleave in the following order till KM bits in the code word, which means K subsets are interleaved and each subset is M bits. (In other words, KM=4*3=12, and KM is not greater than the total number of bits)
5) Let I denote the ith word line and J subset denoted column index. Subset (I, J) is interleaved with subset (T,U) where T!=I, T varies from 1 to I−1 and U is I and with subset (T,U) where T!=I, T varies from I+1 to K and U is I+1. Here, the subset from Ith word line in the failed column is interleaved with columns of word lines T≠I.
6) Repeat interleaving for all K word lines and stored XOR parity and recover the data whenever there is an ECC failure observed.

In some embodiments of the invention, techniques are provided to keep track of failed bit lines during the life of the drive and change the interleaver dynamically on the fly to improve performance of chip-kill recovery. In some embodiments, the memory controller or firmware can keep track of failed bit lines and apply an on the fly change of the interleaver dynamically used for writing data, e.g., in a superblock. The interleaver can be designed judiciously in order to avoid failed bit lines. Some embodiments of the invention provide an interleaver technique that can improve the chip-kill recovery scheme significantly. The proposed interleaver scheme can be implemented for generating chip-kill parity in a superblock, and chip-kill parity can be written at the end of the superblock.

In some embodiments, as read commands are issued by the host, the memory controller or firmware can keep track of BER of all bit locations based on the superblock basis. When BER exceeds certain threshold for Mbit locations, an on the fly change interleave is dynamically triggered by the controller or firmware for writing data in that superblock after refresh. The value of M can be chosen heuristically.

In the description below, certain parameters are defined as follows,
1) Let $(k_1, k_2, \ldots k_M)$ denote bit indexes where maximum number of errors are observed.
2) Let $N_{wl}$ denote number of word lines in a superblock.
3) Let $B_{wl}$ denote number of bits in a word line.
In FIG. 5B, bits are arranged based on failed bits lines in front of bit lines. Whole word line data is divided in M chunks or subsets, and bits from the failed bit lines are placed at the front. In this example, M, $N_{wl}$, and $B_{wl}$ are assumed to be 3, 5, and 12, for simplicity.

The controller or firmware can pick a value of M satisfying the following constraint based on the number of bits in a word line and number of word lines in a superblock.

$$M \le B_{wl}/(N_{wl}-1)$$

In some embodiments, the interleaver scheme is shown in FIG. 3 and FIG. 4 with satisfying conditions as $M=B_{wl}/(N_{wl}-1)$ and $M<B_{wl}/(N_{wl}-1)$ respectively.

In FIGS. 6A-6D, $M=B_{wl}/(N_{wl}-1)$. The values of M, $B_{wl}$, and $N_{wl}$ are assumed 3, 12, and 5 for simplicity. The shaded data chunks or subsets are used to generate XOR parity.

In FIG. 7A-7D, $M<B_{wl}/(N_{wl}-1)$. Values of M, $B_{wl}$, and $N_{wl}$ are assumed 3, 12, and 4 for simplicity. The shaded data chunks or subsets are used to generate XOR parity.

It is noted that bad bit lines are interleaved with good bit lines in the interleaver scheme and can be easily recovered through XOR written at the last word line of the superblock.

Figure 8:
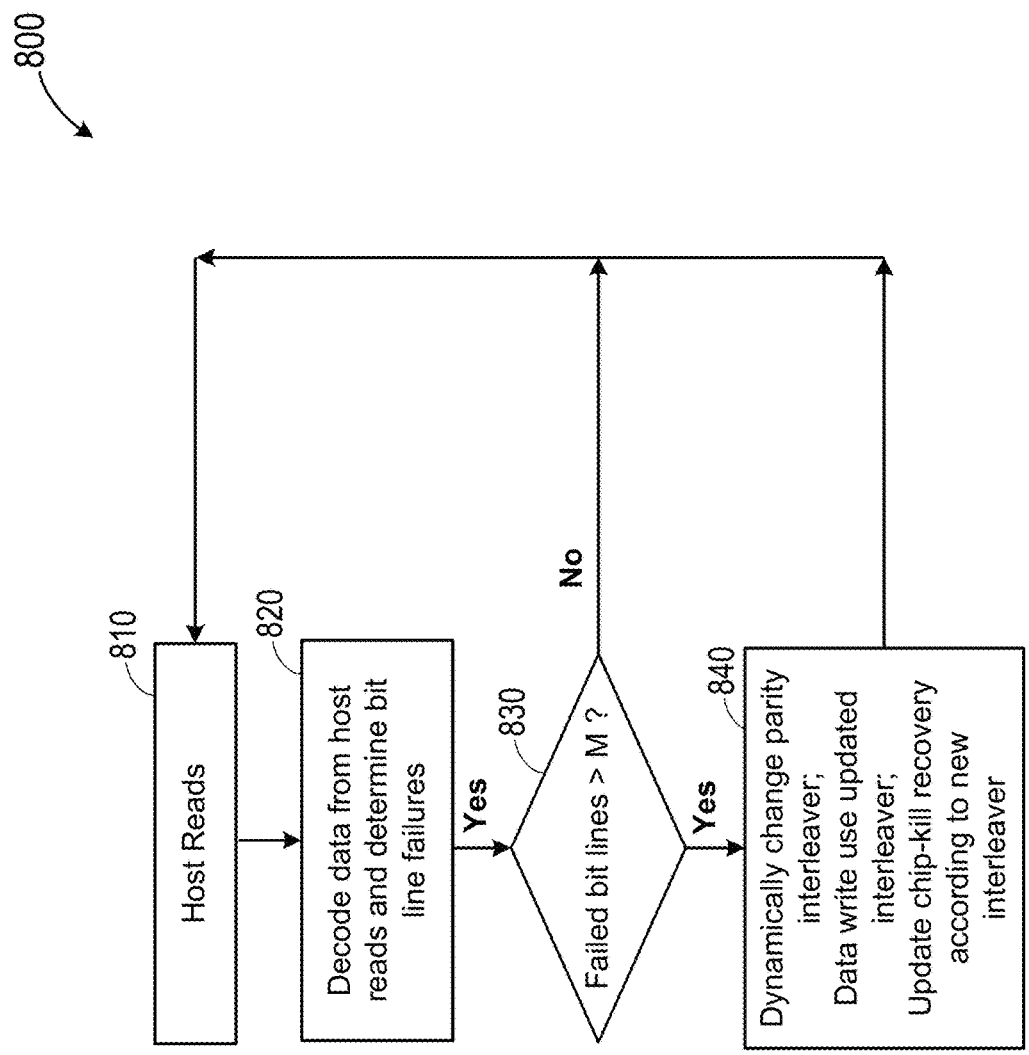
FIG. 8 is a simplified flowchart showing a method for a dynamic interleaver according to some embodiments of the invention.

FIG. 8 is a simplified flowchart showing a method for a dynamic interleaver according to some embodiments of the invention. In some cases, the values of M and T are chosen heuristically. The method for dynamic interleaver includes, at 810, perform host reads. After receiving a read command from a host, the controller can perform read operations. At 820, the controller decodes data from host reads and determine bit line failures. The bit lines having a high number of bit failures are determined. At 830, the number of failed bit lines with high failures is compared with a threshold for triggering the dynamic interleaver function. Depending on the size of the block or superblock, a threshold for triggering the dynamic interleaver can be, e.g., 5 to 50. At 840, the controller dynamically changes the parity interleaver. At this point, data write operations adopts the updated interleaver for parity bits computation. In some embodiments, chip-kill recovery is updated according to new interleaver.

Figure 10:
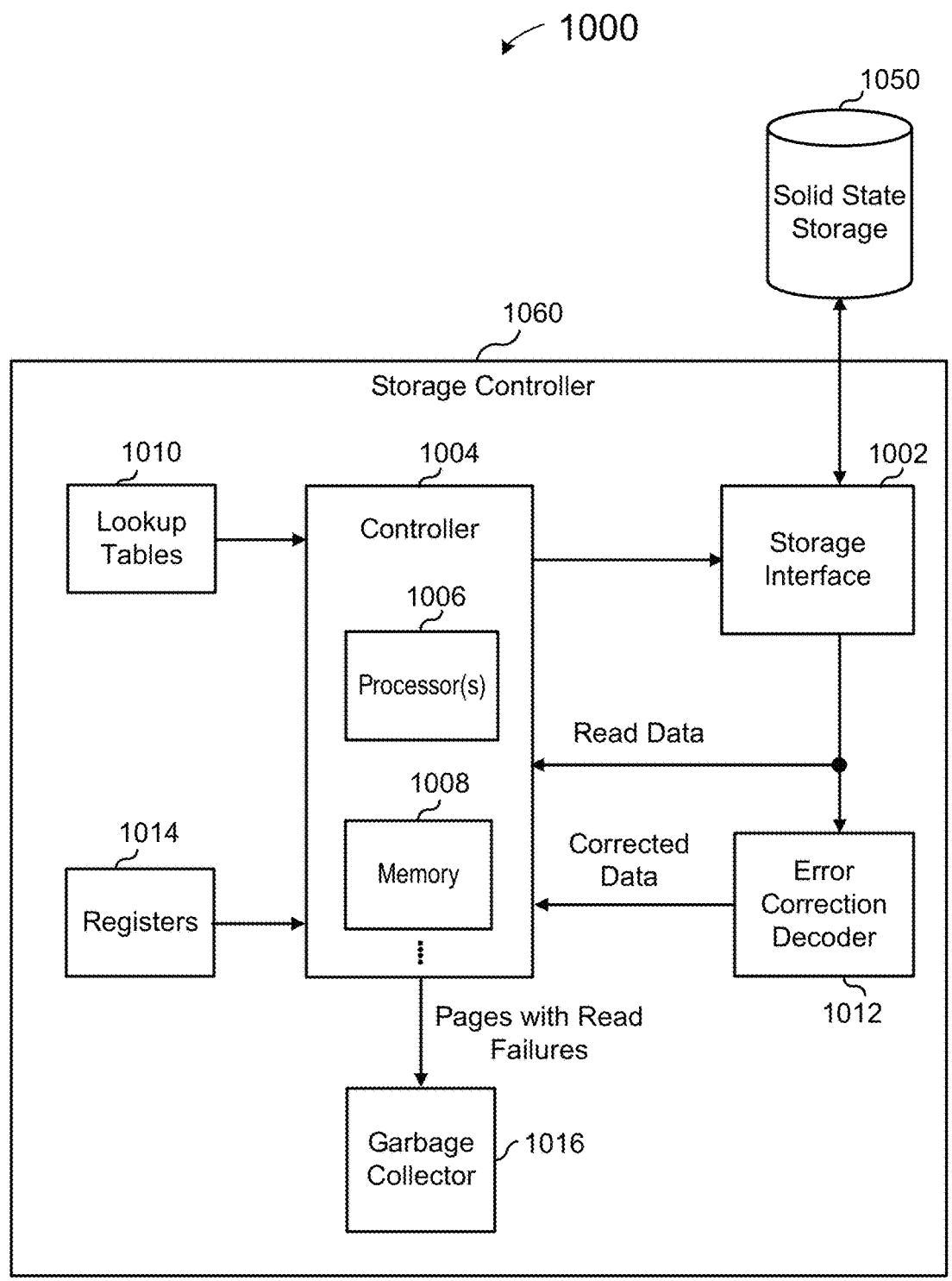
FIG. 10 is a simplified block diagram illustrating a solid state storage system according to some embodiments of the present invention.

FIG. 10 is a simplified flowchart illustrating a dynamic interleave process for parity computation according to embodiments of the present invention. In a storage device, memory cells are arranged in a two-dimensional array having rows and columns, each row associated with a word line and each column associated with a bit line. The storage device also has a memory controller coupled to the memory cells for controlling operations of the memory cells. The memory controller is configured to decode data from a read operation to identify error count in each bit line and determine that there are M failed bit lines that have error counts exceeding a threshold value. The controller performs interleave of data bits to form parity bits by forming multiple groups of data bits, wherein each group of data bits includes one data bit from each word line and each group of data bits includes at most one data bit from any of the M failed bit lines. The controller also computes a parity bit for each group of data bits. In this process, each group of data bits includes at most one error bit from the M failed bit lines.

Figure 9:
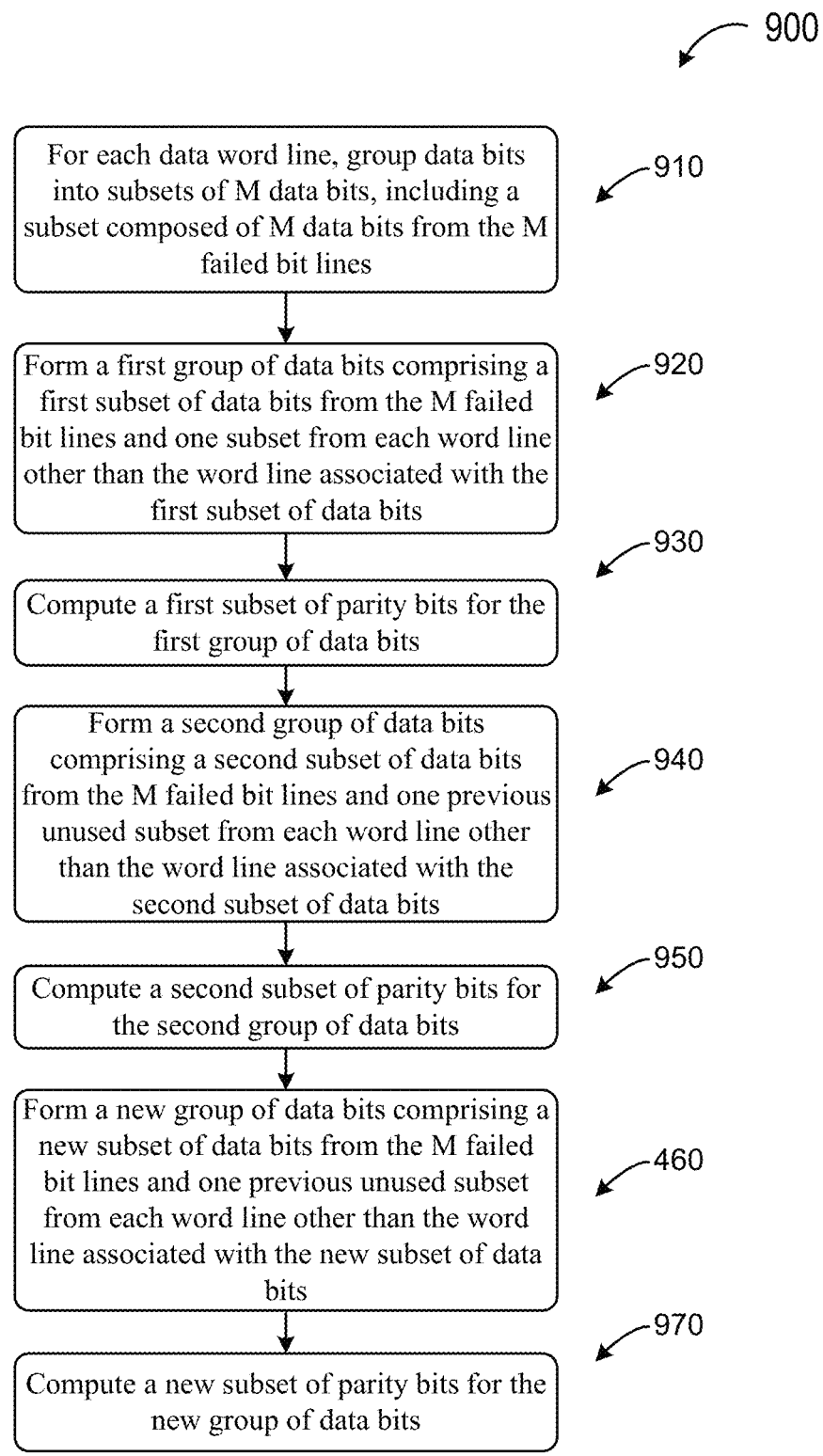
FIG. 9 is a simplified flowchart illustrating a method for a dynamic interleaver for determining parity bits according to some embodiments of the invention.

FIG. 9 is a simplified flowchart illustrating a method for dynamic interleave for determining parity bits according to some embodiments of the invention. Examples of the method 900 are described above in connections with FIGS. 6A-6D and FIGS. 7A-7D. The method can be summarized as follows. At 910, for each data word line, data bits are grouped into subsets of M data bits, including a subset composed of M data bits from the M failed bit lines. Here, for a parity word line, forming subsets of parity bits, wherein each subset of parity bits are computed for a group of data bits comprising one subset from each word line and including only one subset of data bits from the M failed bit lines. This process is explained further below. At 920, the controller forms a first group of data bits including a first subset of data bits from the M failed bit lines and one subset from each word line other than the word line associated with the first subset of data bits. At 930, a first subset of parity bits are computed for the first group of data bits. At 940, the controller forms a second group of data bits including a second subset of data bits from the M failed bit lines and one previous unused subset from each word line other than the word line associated with the second subset of data bits. At 950, a second subset of parity bits are computed for the second group of data bits. At 960, the controller forms a new group of data bits comprising a new subset of data bits from the M failed bit lines and one previous unused subset from each word line other than the word line associated with the new subset of data bits. At 970, a new subset of parity bits are computed for the new group of data bits.

In some embodiments, the method can also include performing interleave of data bits to form parity bits by forming a new group of data bits comprising one previous unused subset from each word line, and computing a new subset of parity bits for the new group of data bits. In this case, all the subsets involving the failed bit lines have already been included in parity bit groups in the above process, and new groups of data bits can be formed without data bits from the failed bit lines.

In some embodiments, the method can also include performing interleave of data bits to form parity bits by comparing the count of failed bit lines M with a threshold for triggering dynamic interleave. Upon determining that M is greater than the threshold for triggering dynamic interleave, interleave of data bits is performed to form parity bits. In some embodiments, the threshold for dynamic interleave can be varied during the life time of the storage system.

FIG. 10 is a simplified block diagram illustrating a solid state storage system according to some embodiments of the present invention. As shown, solid state storage system 1000 can include a solid state storage device 1050 and a storage controller 1060. For example, solid state storage device 1050 can include a flash memory device 100 as depicted in FIG. 1. Storage controller 1060, also referred to as a memory controller, is one example of a system which performs the techniques described herein. In some embodiments, storage controller 1060 can be implemented on a semiconductor device, such as an ASIC or FPGA. Some of the functions can also be implemented in firmware.

Controller 1004 can include one or more processors 1006 and memories 1008 for performing the control functions described above. Storage controller 1060 can also include lookup tables 1010, which can include a table for degraded blocks and a table for bad blocks, etc. Registers 1014 can be used to store data for control functions, such as threshold values for degraded block counts, etc.

Controller 1004 can be coupled to solid state storage 1050 through a storage interface 1002. Error correction decoder 1012 (e.g., an LDPC decoder or a BCH decoder) can perform error correction decoding on the read data and sends the corrected data to controller 1004. Controller 1004 can identify the pages with read failures to garbage collector 1016, which performs corrective processing on those pages (e.g., by copying the data, with or without error correction decoding, to a new location).

Figure 11:
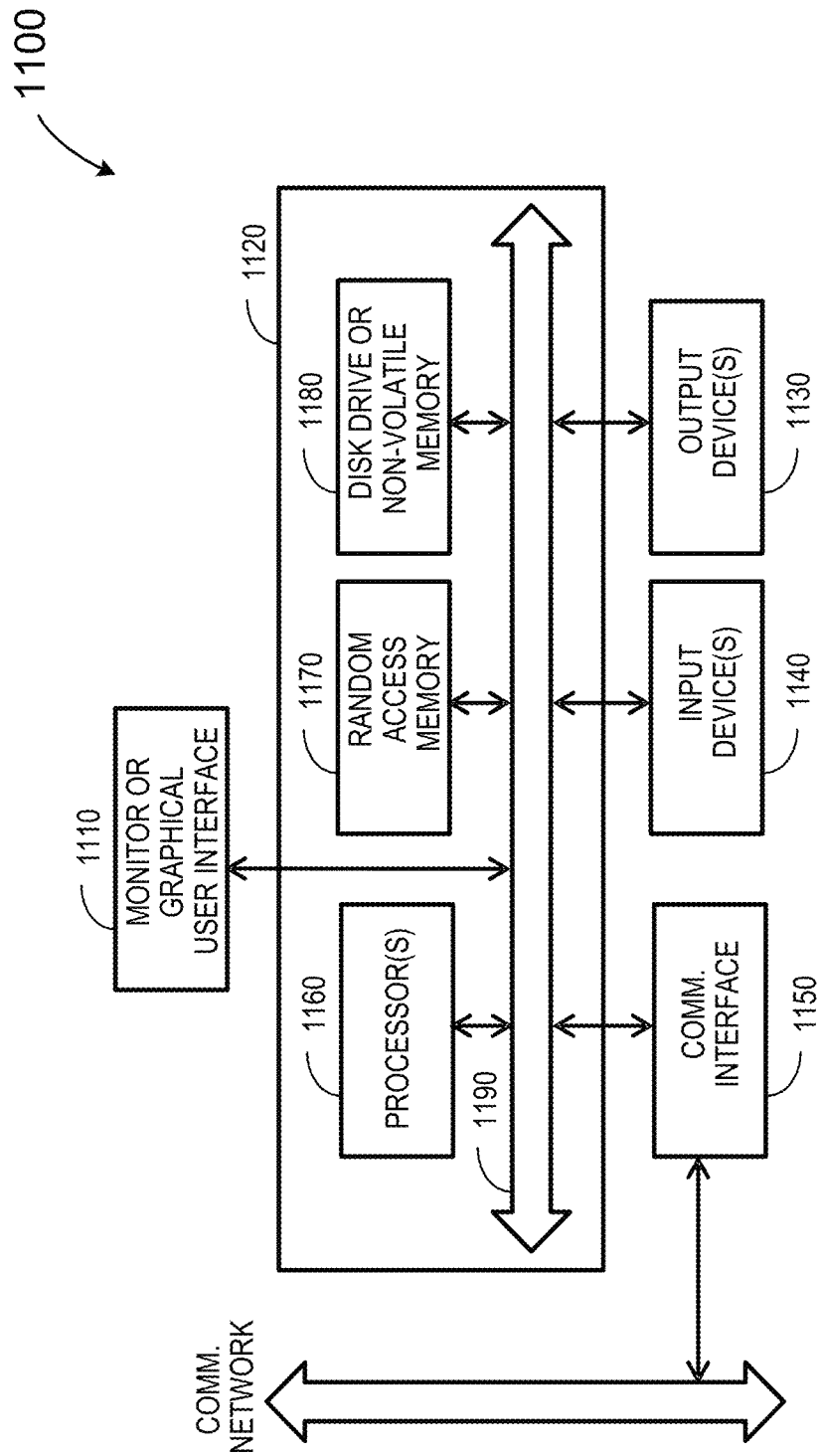
FIG. 11 is a simplified block diagram illustrating an apparatus that may be used to implement various embodiments according the present invention.

FIG. 11 describes one potential implementation of a system which may use embodiments of the present disclosure. FIG. 11 is merely illustrative of an embodiment incorporating the present disclosure and does not limit the scope of the invention as recited in the claims. One of ordinary skill in the art would recognize other variations, modifications, and alternatives. In one embodiment, computer system 1100 typically includes a monitor 1110, a computer 1120, user output devices 1130, user input devices 1140, communications interface 1150, and the like.

As shown in FIG. 11, computer 1120 may include a processor(s) 1160 that communicates with a number of peripheral devices via a bus subsystem 1190. These peripheral devices may include user output devices 1130, user input devices 1140, communications interface 1150, and a storage subsystem, such as random access memory (RAM) 1170 and disk drive 1180. As an example, a disk drive can include solid state disk (SSD) implemented with non-volatile memory devices such as memory device 100 depicted in FIG. 1 with features described above.

User input devices 1140 include all possible types of devices and mechanisms for inputting information to computer system 1120. These may include a keyboard, a keypad, a touch screen incorporated into the display, audio input devices such as voice recognition systems, microphones, and other types of input devices. In various embodiments, user input devices 1140 are typically embodied as a computer mouse, a trackball, a track pad, a joystick, wireless remote, drawing tablet, voice command system, eye tracking system, and the like. User input devices 1140 typically allow a user to select objects, icons, text and the like that appear on the monitor 1110 via a command such as a click of a button or the like.

User output devices 1130 include all possible types of devices and mechanisms for outputting information from computer 1120. These may include a display (e.g., monitor 1110), non-visual displays such as audio output devices, etc.

Communications interface 1150 provides an interface to other communication networks and devices. Communications interface 1150 may serve as an interface for receiving data from and transmitting data to other systems. Embodiments of communications interface 1150 typically include an Ethernet card, a modem (telephone, satellite, cable, ISDN), (asynchronous) digital subscriber line (DSL) unit, FireWire interface, USB interface, and the like. For example, communications interface 1150 may be coupled to a computer network, to a FireWire bus, or the like. In other embodiments, communications interfaces 1150 may be physically integrated on the motherboard of computer 1120, and may be a software program, such as soft DSL, or the like.

In various embodiments, computer system 1100 may also include software that enables communications over a network such as the HTTP, TCP/IP, RTP/RTSP protocols, and the like. In alternative embodiments of the present invention, other communications software and transfer protocols may also be used, for example IPX, UDP or the like. In some embodiments, computer 1120 includes one or more Xeon microprocessors from Intel as processor(s) 1160. Further, one embodiment, computer 1120 includes a UNIX-based operating system.

RAM 1170 and disk drive 1180 are examples of tangible media configured to store data such as embodiments of the present invention, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. RAM 1170 and disk drive 1180 may be configured to store the basic programming and data constructs that provide the functionality of the present invention.

Software code modules and instructions that provide the functionality of the present invention may be stored in RAM 1170 and disk drive 1180. These software modules may be executed by processor(s) 1160. RAM 1170 and disk drive 1180 may also provide a repository for storing data used in accordance with the present invention.

RAM 1170 and disk drive 1180 may include a number of memories including a main random access memory (RAM) for storage of instructions and data during program execution and a read only memory (ROM) in which fixed non-transitory instructions are stored. RAM 1170 and disk drive 1180 may include a file storage subsystem providing persistent (non-volatile) storage for program and data files. RAM 1170 and disk drive 1180 may also include removable storage systems, such as removable flash memory.

Bus subsystem 1190 provides a mechanism for letting the various components and subsystems of computer 1120 communicate with each other as intended. Although bus subsystem 1190 is shown schematically as a single bus, alternative embodiments of the bus subsystem may utilize multiple busses. Bus system 1190 may be a PCI Express bus that may be implemented using PCIe PHY embodiments of the present disclosure.

FIG. 11 is representative of a computer system capable of embodying the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present invention can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

The embodiments disclosed herein are not to be limited in scope by the specific embodiments described herein. Various modifications of the embodiments of the present invention, in addition to those described herein, will be apparent to those of ordinary skill in the art from the foregoing description and accompanying drawings. Further, although some of the embodiments of the present invention have been described in the context of a particular implementation in a particular environment for a particular purpose, those of ordinary skill in the art will recognize that its usefulness is not limited thereto and that the embodiments of the present invention can be beneficially implemented in any number of environments for any number of purposes.

What is claimed is:

1. A non-volatile data storage device, comprising:
memory cells arranged in a two-dimensional array having rows and columns, each row associated with a word line and each column associated with a bit line, memory cells associated with each bit line include multiple data bits and a parity bit derived from the data bits, a parity word line includes a parity bit from each bit line;
a memory controller coupled to the memory cells for controlling operations of the memory cells;
wherein the memory controller is configured to:
perform a read operation in response to a read command from a host;
decode data from the read operation to identify error count in each bit line and determine that there are M failed bit lines that have error counts exceeding a threshold value;
perform interleave of data bits to form parity bits by:
for each data word line, grouping data bits into subsets of M data bits, including a subset composed of M data bits from the M failed bit lines; and
for a parity word line, forming subsets of parity bits, wherein each subset of parity bits are computed for a group of data bits comprising one subset from each word line and including only one subset of data bits from the M failed bit lines;
whereby each group includes at most one error bit from the M failed bit lines; and
perform data write operations including using the interleave of data bits to form parity bits.

2. The non-volatile data storage device of claim 1, wherein the memory controller is further configured to perform interleave of data bits to form parity bits by:
forming a first group of data bits comprising a first subset of data bits from the M failed bit lines and one subset from each word line other than the word line associated with the first subset of data bits;
computing a first subset of parity bits for the first group of data bits;
forming a second group of data bits comprising a second subset of data bits from the M failed bit lines and one previous unused subset from each word line other than the word line associated with the second subset of data bits;
computing a second subset of parity bits for the second group of data bits;
forming a new group of data bits comprising a new subset of data bits from the M failed bit lines and one previous unused subset from each word line other than the word line associated with the new subset of data bits;
compute a new subset of parity bits for the new group of data bits.

3. The non-volatile data storage device of claim 2, wherein the memory controller is further configured to perform interleave of data bits to form parity bits by:
forming a new group of data bits comprising one previous unused subset from each word line; and
computing a new subset of parity bits for the new group of data bits.

4. The non-volatile data storage device of claim 1, wherein the memory controller is further configured to perform interleave of data bits to form parity bits by:
comparing the count of failed bit lines M with a threshold for triggering dynamic interleave;
upon determining that M is greater than the threshold for triggering dynamic interleave, performing interleave of data bits to form parity bits.

5. The non-volatile data storage device of claim 4, wherein the memory controller is configured to determine heuristically the threshold for dynamic interleave.

6. The non-volatile data storage device of claim 4, wherein the memory controller is configured to vary the threshold for dynamic interleave during a life time of the non-volatile data storage device.

7. The non-volatile data storage device of claim 1, wherein the memory controller is configured to compute parity bits by an exclusive-OR (XOR) operation of selected data bits.

8. A non-volatile data storage device, comprising:
memory cells arranged in a two-dimensional array having rows and columns, each row associated with a word line and each column associated with a bit line;
a memory controller coupled to the memory cells for controlling operations of the memory cells;
wherein the memory controller is configured to:
decode data from a read operation to identify error count in each bit line and determine that there are M failed bit lines that have error counts exceeding a threshold value;
perform interleave of data bits to form parity bits by:
forming multiple groups of data bits, wherein each group of data bits includes one data bit from each word line and each group of data bits includes at most one data bit from any of the M failed bit lines, and
computing a parity bit for each group of data bits;
whereby each group of data bits includes at most one error bit from the M failed bit lines;
perform data write operations including using the interleave of data bits to form parity bits.

9. The non-volatile data storage device of claim 8, wherein the memory controller is further configured to perform interleave of data bits to form parity bits by:
for each data word line, grouping data bits into subsets of M data bits, including a subset composed of M data bits from the M failed bit lines; and
for a parity word line, forming subsets of parity bits, wherein each subset of parity bits are computed for a group of data bits comprising one subset from each word line and including only one subset of data bits from the M failed bit lines.

10. The non-volatile data storage device of claim 9, wherein the memory controller is further configured to perform interleave of data bits to form parity bits by:
forming a first group of data bits comprising a first subset of data bits from the M failed bit lines and one subset from each word line other than the word line associated with the first subset of data bits;
computing a first subset of parity bits for the first group of data bits;
forming a second group of data bits comprising a second subset of data bits from the M failed bit lines and one previous unused subset from each word line other than the word line associated with the second subset of data bits;
computing a second subset of parity bits for the second group of data bits;
forming a new group of data bits comprising a new subset of data bits from the M failed bit lines and one previous unused subset from each word line other than the word line associated with the new subset of data bits;

compute a new subset of parity bits for the new group of data bits.

11. The non-volatile data storage device of claim 10, wherein the memory controller is further configured to perform interleave of data bits to form parity bits by:
forming a new group of data bits comprising one previous unused subset from each word line; and
computing a new subset of parity bits for the new group of data bits.

12. The non-volatile data storage device of claim 8, wherein the memory controller is further configured to perform interleave of data bits to form parity bits by:
comparing the count of failed bit lines M with a threshold for triggering dynamic interleave;
upon determining that M is greater than the threshold for triggering dynamic interleave, performing interleave of data bits to form parity bits.

13. The non-volatile data storage device of claim 12, wherein the memory controller is configured to vary the threshold for dynamic interleave during a life time of the non-volatile data storage device.

14. The non-volatile data storage device of claim 8, wherein the memory controller is configured to compute parity bits by an exclusive-OR (XOR) operation of selected data bits.

15. A method of controlling a storage system, the storage system including memory cells arranged in a two-dimensional array having rows and columns, each row associated with a word line and each column associated with a bit line and a memory controller coupled to the memory cells for controlling operations of the memory cells, the method comprising:
performing a read operation in response to a read command from a host;
decoding data from the read operation to identify error count in each bit line and determine that there are M failed bit lines that have error counts exceeding a threshold value;
performing interleave of data bits to form parity bits by:
forming multiple groups of data bits, wherein each group of data bits includes one data bit from each word line and each group of data bits includes at most one data bit from any of the M failed bit lines, and
performing data write operations including using the interleave of data bits to form parity bits.

16. The method of claim 15, further comprising performing interleave of data bits to form parity bits by:
for each data word line, grouping data bits into subsets of M data bits, including a subset composed of M data bits from the M failed bit lines; and
for a parity word line, forming subsets of parity bits, wherein each subset of parity bits are computed for a group of data bits comprising one subset from each word line and including only one subset of data bits from the M failed bit lines.

17. The method of claim 16, further comprising performing interleave of data bits to form parity bits by:
forming a first group of data bits comprising a first subset of data bits from the M failed bit lines and one subset from each word line other than the word line associated with the first subset of data bits;
computing a first subset of parity bits for the first group of data bits;
forming a second group of data bits comprising a second subset of data bits from the M failed bit lines and one previous unused subset from each word line other than the word line associated with the second subset of data bits;
computing a second subset of parity bits for the second group of data bits;
forming a new group of data bits comprising a new subset of data bits from the M failed bit lines and one previous unused subset from each word line other than the word line associated with the new subset of data bits;
compute a new subset of parity bits for the new group of data bits.

18. The method of claim 17, further comprising performing interleave of data bits to form parity bits by:
forming a new group of data bits comprising one previous unused subset from each word line; and
computing a new subset of parity bits for the new group of data bits.

19. The method of claim 15, wherein further comprising performing interleave of data bits to form parity bits by:
comparing the count of failed bit lines M with a threshold for triggering dynamic interleave;
upon determining that M is greater than the threshold for triggering dynamic interleave, performing interleave of data bits to form parity bits.

20. The method of claim 19, further comprising varying the threshold for dynamic interleave during a life time of the storage system.

* * * * *